June 30, 1964

KUNISHIRO SAITO 3,139,535

VARIABLE PULSE WIDTH CIRCUIT

Filed April 4, 1961

Inventor
K. Saito
By [signature]
Attorney

United States Patent Office 3,139,535
Patented June 30, 1964

3,139,535
VARIABLE PULSE WIDTH CIRCUIT

Kunishiro Saito, Tokyo, Japan, assignor to Nippon Electric Company, Limited, Tokyo, Japan, a corporation of Japan Filed Apr. 4, 1961, Ser. No. 121,266
Claims priority, application Japan Apr. 18, 1960
10 Claims. (Cl. 307—88.5)

This invention relates to improvements in a circuit for changing a pulse width in a transistor pulse circuit. Many of the conventional methods for changing pulse widths have utilized regenerative feed-back action and the charge and discharge time of an RC network as in a monostable circuit using, for instance, two junction type transistors.

This invention enables one to control the width of a pulse without utilizing such a regenerative feedback action, by delaying the output pulse solely by the charge and discharge time of an RC network, and has an advantage in requiring only one junction type transistor.

The invention also enables one to both amplify a pulse and selectively control its width in a single stage.

Accordingly, it is an object of the invention to provide a single stage variable pulse width amplifier.

It is a further object of the invention to provide a pulse amplifier having a variable time constant input circuit.

It is another object of the invention to provide a variable pulse width amplifier having a time constant circuit whose parameters are selectively controlled by a control potential.

The above-mentioned and other features and objects of this invention and the manner of attaining them will become more apparent and the invention itself will be best understood by reference to the following description of an embodiment of the invention taken in conjunction with the accompanying drawings, in which.

Figure 1:
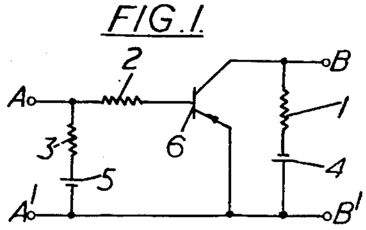
FIG. 1 shows a schematic diagram of a conventional pulse amplifier circuit.

Referring now to FIG. 1, there is shown a conventional circuit of a pulse amplifier using a PNP transistor 6, to which is connected load resistance 1, a series base resistance 2, a base bias resistance 3, a source battery 4, a battery 5 for furnishing a reverse bias to the emitter of transistor 6. If an NPN transistor is used, the result will be quite similar if the several polarities are reversed.

Figure 2:
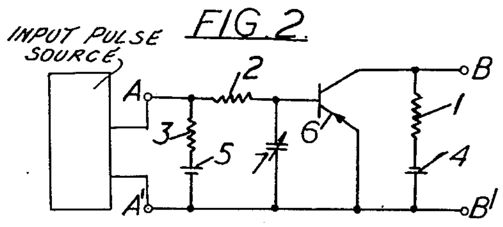
FIG. 2 is a schematic diagram of a variable pulse width circuit according to this invention.

FIG. 2 shows a circuit of this invention wherein a condenser 7 is inserted between the base and the emitter electrode (or the earth) of transistor 6. The operation of this circuit will now be explained:

Before a pulse is applied to the terminals A, A′, a reverse voltage is applied to the base electrode B of the transistor 6 due to the reverse bias battery 5, and is also applied to the variable condenser 7 thus charging it. The transistor is then in a non-conducting state. If a constant negative pulse voltage is applied across the input terminals A—A′, current flows through the resistance 2 in a direction such that the condenser 7 will discharge. At this time, the terminal voltage of the condenser changes, not instantly, but gradually due to the RC time constant determined by the values of the resistance 2 and capacity of the condenser 7. This makes the condenser terminal voltage fall gradually and ultimately reach zero potential. The potential across the condenser then rises in the opposite direction such that a forward voltage is applied to the transistor base. After the input pulse is applied across the terminals A—A′, the condenser discharges once and is then again charged in a direction opposite to the previous state, with the result that the flow of the collector current is delayed by the time T during which the voltage of the base reaches the forward bias voltage. If, at this time, the transistor becomes conductive, the resistance of transistor between the base and the emitters becomes very low, with the result that the input pulse current flows through the transistor. This condition is not generally influenced by the existence of the condenser 7.

Figure 4:
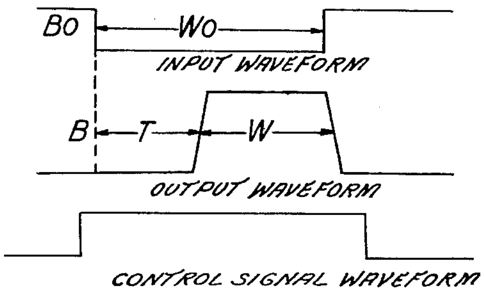
FIG. 4 is an explanation diagram showing time relations of input and output voltages in the circuit of this invention.
Figure 5:
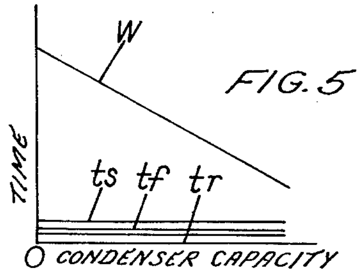
FIG. 5 is an explanatory diagram showing the relation of the condenser capacity to the output pulse width in this invention.

FIG. 4 shows the relation in time of the input pulse voltage $E_0$ and the output pulse voltage E, where $W_0$ is the input pulse width and W is the output pulse width. The delay time T may be changed by changing the input pulse voltage, the voltage of the battery 5, the magnitude of the resistance 2 and the capacity of the condenser 7. The simplest and most practical way is to change the condenser capacity and keep the other parameters constant. To show an example of the measurement, the output pulse width can be controlled in a broad range and a stable manner as shown by curve W in FIG. 5, wherein the abscissa is the condenser capacity and the ordinate is the output pulse width. Change of the capacity of the condenser 7 hardly has any effect upon the rise time $t_r$, the hole storage time $t_s$, and the fall time $t_f$ of the output pulse, as shown in FIG. 5. They are nearly the same as those without an inserted condenser, and afford no appreciable variation in the pulse width.

Figure 3:
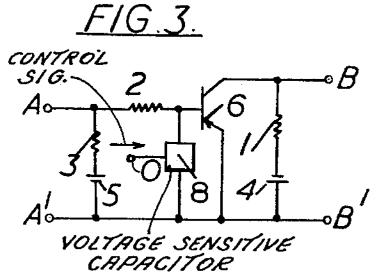
FIG. 3 is a schematic diagram of a modification of the circuit shown in FIG. 2.

As described above, this invention is characterized by an easy and stable adjustment of an output pulse width by using a transistor and changing a condenser capacity. This circuit can be utilized, not only to vary pulse width, but also to pulse position modulation and pulse width modulation by changing, with a signal, the capacity of the condenser. For instance, as shown in FIG. 3, by replacing the condenser by an element 8 whose capacity is altered by a signal applied to the terminal O, the delay times of the standard pulses from the terminals B—B′ are controlled by the signal. This enables achieving pulse width modulation, and, by further arranging differential and shaping circuits in cascade to this circuit, so-called pulse position modulation may be obtained in which the positions of pulses generated are controlled in accordance with the signal. As can be seen from the above examples, this circuit can be applied to all fields relating to the pulse width variation.

While I have described above the principles of my invention in connection with specific apparatus, it is to be clearly understood that this description is made only by way of example and not as a limitation to the scope of my invention as set forth in the objects thereof and in the accompanying claims.

What is claimed is:

1. A circuit which responds to input pulses and supplies output pulses having a time duration which is selectively variable, said circuit comprising a unilateral conducting device including first, second and third electrodes, a first source of current coupled between said first and second electrodes, a second source of current coupled between said second and third electrodes, a variable time constant network connected between said second and third electrodes, said network comprising a capacitive element having first, second and third terminals, the first and second terminals of said capacitive element being connnected to the respective second and third electrodes of said unilateral conducting device, means coupled to the third terminal of said capacitive element for supplying a control signal to produce variations in the reactance of said capacitive element, first and second input terminals, means coupling said first and second input terminals across said variable time constant network, and means coupled to said first and second input terminals for supplying input pulses to said network, whereby said unilateral conducting device provides output pulses having trailing edges which are substantially coincident with the trailing edges of the input pulses and the output pulses have leading edges delayed with respect to the leading edges of the input pulses by an amount determined by the capacitive element.

2. The circuit according to claim 1 wherein said variable time constant network includes a resistor connected between said first input terminal and said third electrode.

3. A circuit which responds to input pulses and supplies output pulses having a time duration which is selectively variable, said circuit comprising a transistor including first, second and third electrodes, a first source of current coupled between said first and second electrodes, a second source of current coupled between said second and third electrodes, a variable time constant network connected between said second and third electrodes, said network comprising a variable capacitive element having first, second and third terminals, the first and second terminals of said capacitive element being connected to the respective second and third electrodes of said transistor, means coupled to the third terminal of said capacitive element for supplying a control signal to produce variations in the reactance of said capacitive element, first and second input terminals, means coupling said first and second input terminals across said variable time constant network, and means coupled to said first and second input terminals for supplying input pulses to said network, whereby said circuit provides output pulses having trailing edges which are substantially coincident with the trailing edges of the input pulses and the output pulses have leading edges delayed in time with respect to the leading edges of the input pulses with the amount of the delay being controlled by the variable capacitive element.

4. A circuit which responds to input pulses and supplies output pulses having a time duration which may be selectively varied, said circuit comprising a transistor including a base, emitter and collector electrodes, a first source of current coupled between said emitter and collector electrodes, a second source of current coupled between said emitter and base electrodes for biasing said transistor into a nonconducting state, a variable time constant network connected between said second and third electrodes, said network comprising a variable capacitive element having first, second and third terminals, the first and second terminals of said capacitive element being connected between the emitter and base electrodes of said transistor, signal means coupled to the third terminal of said capacitive element for supplying a control signal to produce variations in the reactance of said capacitive element, first and second input terminals, means coupling said first and second input terminals across said variable time constant network, and means coupled to said base and emitter electrodes for supplying input pulses to said network, whereby said circuit provides output pulses having trailing edges which are substantially coincident with the trailing edges of the input pulses and the output pulses have leading edges delayed in time with respect to the leading edges of the input pulses with the amount of the delay being controlled by the variable capacitive element under control of the signal from said signal means.

5. A circuit which responds to input pulses and supplies output pulses having a time duration which is selectively variable, said circuit consisting essentially of a unilateral conducting device including first, second and third electrodes, a first source of current coupled between said first and second electrodes, a second source of current coupled between said second and third electrodes, a variable time constant network connected between said second and third electrodes, said network comprising a capacitive element having at least first and second terminals being connected to the respective second and third electrodes of said unilateral conducting device, first and second input terminals, means coupling said first and second input terminals across said variable time constant network, and means coupled to said first and second input terminals for supplying input pulses to said network, whereby said unilateral conducting device provides output pulses having trailing edges which are substantially coincident with the trailing edges of the input pulses and the output pulses have leading edges delayed with respect to the leading edges of the input pulses by an amount determined by the capacitive element.

6. The circuit according to claim 5 wherein said variable time constant network includes a resistor connected between said first input terminal and said third electrode.

7. A circuit which responds to input pulses and supplies output pulses having a time duration which is selectively variable, said circuit comprising a transistor including first, second and third electrodes, a first source of current coupled between said first and third electrodes, a second source of current coupled between said second and third electrodes, a variable time constant network connected between said second and third electrodes, said network comprising a variable capacitive element having at least first and second terminals being connected to the respective second and third electrodes of said transistor, first and second input terminals, means coupling said first and second input terminals across said variable time constant network, and means coupled to said first and second input terminals for supplying input pulses to said network, whereby said circuit provides output pulses having trailing edges which are substantially coincident with the trailing edges of the input pulses and the output pulses have leading edges delayed in time with respect to the leading edges of the input pulses with the amount of the delay being controlled by the variable capacitive element.

8. A variable pulse width circuit comprising a solid-state pulse amplifier having three electrodes, a first source of potential for energizing said amplifier, said source coupled between a first and a second of said electrodes, a second source of potential for biasing a third of said electrodes, a variable time constant network comprising a voltage sensitive capacitor whose capacity is adapted to be selectively varied by the application of a control potential disposed intermediate said second electrode and said third electrode, means for impressing incoming pulses across said second and third electrode, and means for deriving output pulses from said first and second electrodes, the width of said output pulses being dependent upon the parameters of said network.

9. A variable pulse width circuit as claimed in claim 8, wherein said capacitor is a three terminal device of which two terminals are in shunt between said second and said third electrodes and the third terminal of which is adapted to be connected to a source of control potential.

10. A variable pulse width circuit comprising a solid-state pulse amplifier having three electrodes, a first source of potential for energizing said amplifier, said source coupled between a first and a second of said electrodes, a second source of potential for biasing a third of said electrodes, a variable time constant network comprising a device whose reactance is variable in accordance with an applied potential disposed intermediate said second electrode and said third electrode, means for impressing incoming pulses across said second and third electrode, and means for deriving output pulses from said first and second electrodes, the width of said output pulses being dependent upon the parameters of said network.

References Cited in the file of this patent

UNITED STATES PATENTS

| | | |
|---|---|---|
| 2,818,532 | Aitel | Dec. 31, 1957 |
| 2,900,534 | Chater | Aug. 18, 1959 |
| 2,947,916 | Beck | Aug. 2, 1960 |
| 2,998,545 | Smyth | Aug. 29, 1961 |